US010944256B2

(12) United States Patent
Muljono et al.

(10) Patent No.: US 10,944,256 B2
(45) Date of Patent: Mar. 9, 2021

(54) ON-DIE CIRCUITRY FOR ELECTROSTATIC DISCHARGE PROTECTION (ESD) ANALYSIS

(71) Applicant: Intel Corporation, Santa Clara, CA (US)

(72) Inventors: Harry Muljono, Union City, CA (US); Horaira Abu, Fremont, CA (US); Linda K. Sun, Fremont, CA (US)

(73) Assignee: Intel Corporation, Santa Clara, CA (US)

(*) Notice: Subject to any disclaimer, the term of this patent is extended or adjusted under 35 U.S.C. 154(b) by 328 days.

(21) Appl. No.: 15/939,807

(22) Filed: Mar. 29, 2018

(65) Prior Publication Data
US 2019/0305549 A1 Oct. 3, 2019

(51) Int. Cl.
H02H 9/04 (2006.01)
H01L 27/02 (2006.01)

(52) U.S. Cl.
CPC ......... *H02H 9/046* (2013.01); *H01L 27/0248* (2013.01); *H02H 9/041* (2013.01)

(58) Field of Classification Search
CPC .... H02H 9/046; H02H 9/041; H01L 27/0248; H01L 27/0292
See application file for complete search history.

(56) References Cited

U.S. PATENT DOCUMENTS 10,373,948 B2 * 8/2019 Mozak ................ H01L 27/0255
2004/0252426 A1 * 12/2004 Hargrove ............ H01L 27/0255
361/56

(Continued)

FOREIGN PATENT DOCUMENTS

CN 101398463 4/2009
WO 2004059734 7/2004

OTHER PUBLICATIONS

"International Application Serial No. PCT US2019 024622, International Search Report dated Aug. 9, 2019", 3 pgs.

(Continued)

Primary Examiner — Alex Torres-Rivera
(74) Attorney, Agent, or Firm — Schwegman Lundberg & Woessner, P.A.

(57) ABSTRACT

Some embodiments include apparatuses having an electrostatic discharge (ESD) protection circuit coupled to a node, and first, second, and third circuits coupled to the node. The first circuit includes a first charge pump to cause a voltage at the node during activation of the first circuit to change from a first voltage value to a second voltage value within first multiple periods of a clock signal, the second voltage value being less than the first voltage value. The second includes a second charge pump to cause a voltage at the node during activation of the second circuit to change from a third voltage value to a fourth voltage value during second multiple periods of the clock signal, the fourth voltage value being greater than the third voltage value. The third circuit generates information based on the values of the voltage at the node during activation of the first and second circuits. The apparatuses optionally include a fourth circuit to generate an additional voltage at an additional node. The additional voltage has a negative voltage value. The additional node is coupled to a gate of at least one transistor of the first circuit.

15 Claims, 7 Drawing Sheets

(56) References Cited

U.S. PATENT DOCUMENTS

| | | | |
|---|---|---|---|
| 2011/0176245 A1* | 7/2011 | Worley | H03F 1/52 |
| | | | 361/56 |
| 2011/0286136 A1 | 11/2011 | Tsai | |
| 2012/0236444 A1* | 9/2012 | Srivastava | H02M 1/32 |
| | | | 361/56 |
| 2013/0026550 A1 | 1/2013 | Yoshioka | |
| 2017/0194786 A1* | 7/2017 | Tzeng | H02H 9/041 |
| 2018/0097357 A1* | 4/2018 | Di Sarro | H02H 9/046 |
| 2018/0269877 A1* | 9/2018 | Stroud | H03K 3/011 |
| 2019/0079126 A1* | 3/2019 | Chen | H01L 27/0255 |
| 2019/0260203 A1* | 8/2019 | Seidl | H02H 1/0007 |

OTHER PUBLICATIONS

"International Application Serial No. PCT US2019 024622, Written Opinion dated Aug. 9, 2019", 5 pgs.

* cited by examiner

ON-DIE CIRCUITRY FOR ELECTROSTATIC DISCHARGE PROTECTION (ESD) ANALYSIS

TECHNICAL FIELD

Embodiments described herein pertain to integrated circuit (IC) devices and systems. Some embodiments relate to electrostatic discharge (ESD) protection in such devices and systems.

BACKGROUND

In electronic devices and systems (e.g., IC chip, cellular phones, and computers), an ESD event occurs when a relatively high electrostatic charge built-up in an object (or in a human) is transferred to the device or system through direct contact or, in some cases, through air. The voltage associated with such an ESD event can be in the range of thousands of kilovolts. This high voltage can damage the device and system. Therefore, many devices and systems have ESD protection circuits to protect them from ESD events. Diodes (ESD diodes) are normally used for such ESD protection. Like other components in the device, ESD diodes are tested as part of quality control purposes. External off-chip test fixtures are usually used to test ESD protection circuits. External off-chip testing can be time consuming and labor intensive. Further, such testing is normally performed only on a representative sample of the devices. Thus, defective devices and devices with poor ESD protection circuit performance may slip through production chain undetectable. This can lead to an increased rate of inferior products and product failures.

DETAILED DESCRIPTION

The technique described herein includes a device (e.g., an IC device) having on-die (e.g., built-in) analysis circuitry to allow analysis of ESD protection circuits in the device. The analysis can be performed before or after the device is installed in an end-user product. Results of the analysis can be used to determine whether the components (e.g., ESD diodes) of ESD protection circuits operate as expected or whether the components are missing or damaged.

ESD and electrical overstress (EOS) induced damages are two factors that often cause a device to operate poorly or fail to operate. As the feature size of the components of the device becomes smaller (e.g., as silicon scales down), the device may be more susceptible to EOS. This may increase the number of defective devices and EOS failure rate. However, many conventional devices (e.g., IC devices) lack on-die circuitry (e.g., to test structures) to analyze ESD protection circuits in the device. Therefore, increased defective device and EOS failure rates remain a consideration.

The techniques described herein can help achieve a reduction in device defect rate (e.g., help achieving zero defect targets) and a reduction in EOS failure rate that may be caused by poor performance or failure of ESD protection circuits in the device. The described on-die analysis circuitry can operate during analysis operations performed on the device to analyze (e.g., automatically evaluate) the integrity of components (e.g., ESD diodes) of the ESD protection circuits of the device. The described on-die analysis circuitry can include components (e.g., charge pumps) to generate a range of voltage (e.g., higher than the I/O supply voltage and lower than ground) for use during the analysis operation. The analysis operation can collect information (e.g., measurement information) based on measured values of a voltage at an I/O terminal coupled to the ESD protection circuit being analyzed. The collected information can be further processed to generate resulting information. Adjustment or improvement of ESD protection circuits of the device can be made based on the resulting information to improve the performance of ESD protection circuits of the device, reduce device defect rate, and reduce EOS.

The on-die analysis circuitry of the techniques described herein can have a relatively small size. Thus, it can be replicated for each I/O terminal of the device without significantly increasing the overall size of the device. The on-die analysis circuitry described herein can also allow analyzing (e.g., testing) every I/O terminal of the device and allow analyzing more than a representative sample of the devices (e.g., analyzing all devices). This can further reduce device defect rate and EOS failure rate.

Figure 1:
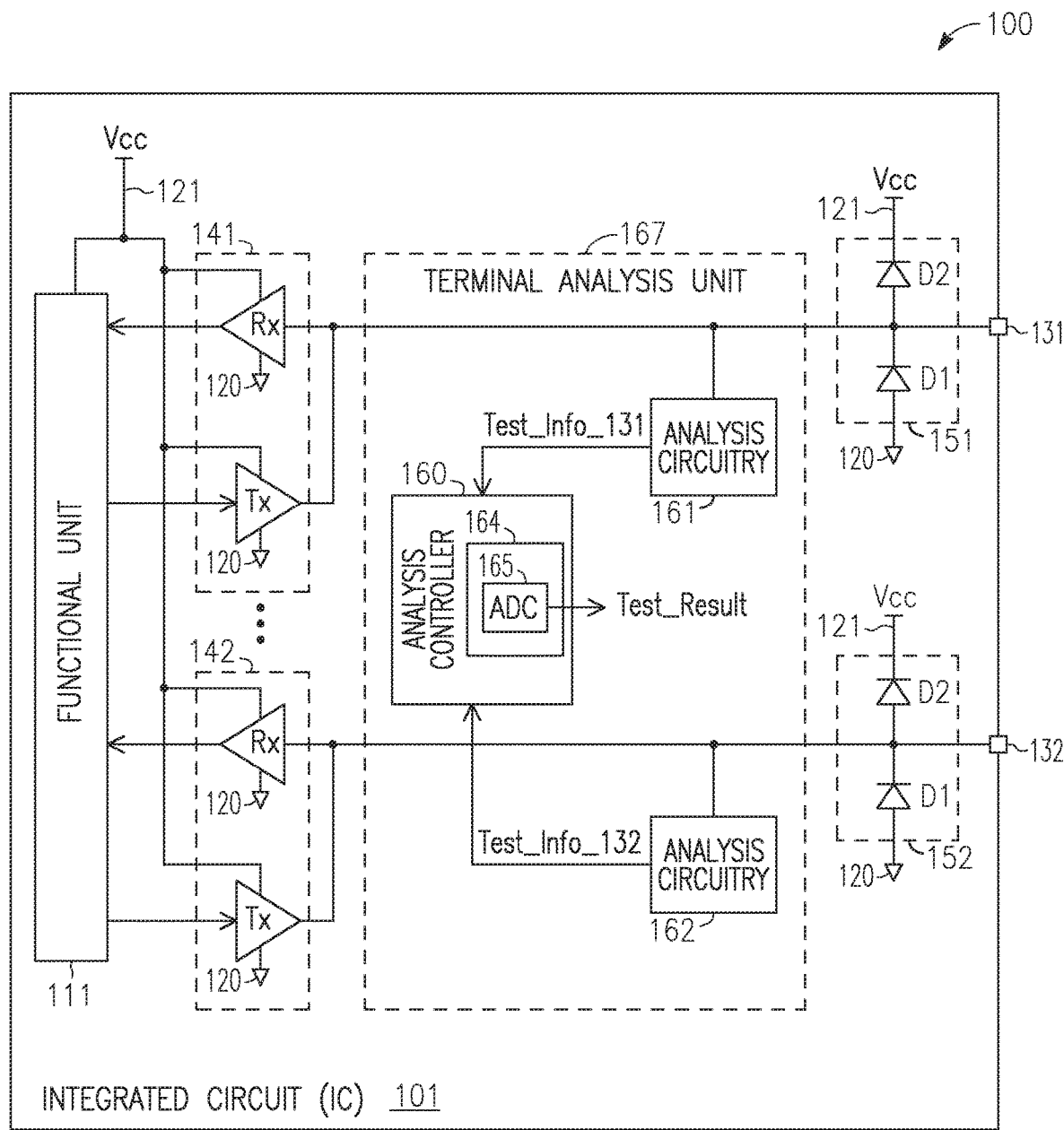
FIG. 1 shows an apparatus including an IC having analysis circuitries, according to some embodiments described herein.

FIG. 1 shows an apparatus 100 including an IC 101 having analysis circuitry, according to some embodiments described herein. Apparatus 100 can include or be included in an electronic device or system, such as a computer (e.g., desktop, laptop, or notebook), a tablet, a cellular phone, or other electronic devices or systems. IC 101 can include a processor, a memory device, a system on chip (SoC), or other electronic devices or systems. IC 101 can include an IC chip that can contain a semiconductor die (e.g., a silicon die) 102. Circuit components of analysis control unit 167 can be located on (e.g., formed in or formed on) the same die (e.g., semiconductor die 102) with other circuitries of IC 101.

IC 101 can include a ground node 120 and a supply node 121 that can be coupled to (or part of) supply rails of IC 101. For example, ground node 120 can be coupled to supply rail Vss. Supply node 121 can be coupled to a supply rail (e.g., voltage $V_{CC}$) of IC 101.

IC 101 can include a functional unit 111 that can be coupled to supply node 121 and use voltage $V_{CC}$ as supply voltage for its operations. Functional unit 111 of IC 101 can include components (e.g., circuits and logic) of a processor (e.g., a central processing unit (CPU) to process information, such as data), a memory device (e.g., to store information), or both.

IC 101 can include nodes 131 and 132, each of which can be an input/output (I/O) node of IC 101. Each of nodes 131 and 132 can carry a signal (e.g., output signal) transmitted by IC 101 (to another device) or a signal (e.g., input signal) received by IC 101 (sent to IC from another device). Each of nodes 131 and 132 can include (or can be part of) an I/O terminal of IC 101. Examples of such I/O terminals include pins (e.g., I/O pins), pads, solder balls, and other types of conductive terminals.

As shown in FIG. 1, IC 101 can include I/O driver circuits 141 and 142, each of which can include a transmitter Tx and a receiver Rx. Transmitter Tx and receiver Rx of each of driver circuits 141 and 142 can be coupled to ground node 120 and supply node 121. In each of driver circuits 141 and 142, transmitter Tx can include an output node coupled to a respective I/O terminal (e.g., node 131 or 132), and receiver Rx can include an input node coupled to a respective I/O terminal (e.g., node 131 or 132).

IC 101 can use each of driver circuits 141 and 142 as an I/O driver circuit (e.g., I/O buffer circuit) to transmit and receive signals through a corresponding I/O terminal of IC 101. For example, IC 101 can use transmitter Tx of driver circuit 141 to transmit an output signal from functional unit 111 to another device through node 131. IC 101 can use receiver Rx of driver circuit 141 to receive an input signal from another device through node 131. Similarly, IC 101 can use transmitter Tx of driver circuit 142 to transmit an output signal from functional unit 111 to another device through node 132. IC 101 can use receiver Rx of driver circuit 142 to receive an input signal from another device through node 132.

FIG. 1 shows IC 101 including two driver circuits 141 and 142 and two associated nodes 131 and 132, as an example. The number of driver circuits and associated nodes (e.g., I/O terminals) of IC 101 can vary.

As shown in FIG. 1, IC 101 can include ESD protection circuits 151 and 152 coupled to nodes 131 and 132, respectively. Each of ESD protection circuits 151 and 152 can include a separate set of diodes D1 and D2 coupled to a respective I/O terminal (e.g., node 131 or node 132). In ESD protection circuit 151, diode D1 can be coupled between node 131 and ground node 120, and diode D2 can coupled between node 131 and supply node 121. In ESD protection circuit 152, diode D1 can be coupled between node 132 and ground node 120, and diode D2 can coupled between node 132 and supply node 121.

Diode D1 can operate to protect IC 101 from a high negative voltage (e.g., a negative voltage in kilovolts range) caused by an ESD event. For example, when a negative voltage ESD occurs at node 131, diode D1 at node 131 can form a circuit path between ground node 120 and node 131. This allows current (ESD current) to flow from ground node 120 to node 131, thereby protecting IC 101 from damage that may be caused by the negative voltage ESD event.

Diode D2 can operate to protect IC 101 from a high positive voltage (e.g., a positive voltage in kilovolts range) caused by an ESD event. For example, when a positive voltage ESD event occurs at node 131, diode D2 at node 131 can form a circuit path form a circuit path between node 131 and supply node 121. This allows current (ESD current) to flow from node 131 to supply node 121, thereby protecting IC 101 from damage that may be caused by the positive voltage ESD event.

As shown in FIG. 1, IC 101 101 can include an analysis control unit 167 that can operate to analyze the operation at I/O terminals (e.g., nodes 131 and 132) of IC 101. Analysis control unit 167 can include an analysis controller 160, analysis, analysis circuitry 161 coupled to node 131, and analysis circuit 162 coupled to node 132. IC 101 can include an analysis mode (e.g., a test mode) to analyze (e.g., to test) the condition (e.g., the operation, the physical structure, or both) of ESD protection circuits 151 and 152. Analysis circuitries 161 and 162 can be activated independent from each other during the analysis operation in the analysis mode of IC 101 to test ESD protection circuits 151 and 152, respectively. In a normal operation of IC 101, analysis circuitries 161 and 162 can be deactivated (e.g., disabled), such that analysis circuitries 161 and 162 may not be involved with the normal operation of IC 101.

Analysis circuitry 161 can perform an operation (e.g., measurement operation), which can be part of the analysis operation (e.g., a test operation) performed on node 131. The operation performed by analysis circuitry 161 can include measuring (e.g., sensing) voltage values of the voltage at node 131 during a time interval (e.g., test time interval) of the analysis operation (e.g., test operation). Analysis circuitry 161 can provide (e.g., generate) information (e.g., measurement information) Test_Info_131, which can include voltage values based on the measured (e.g., sensed) voltage values from node 131. Thus, information Test_Info_131 can include an analog voltage signal.

Analysis circuitry 162 can perform an operation (e.g., measurement operation), which can be part of an analysis operation (e.g., test operation) performed on node 132. The operation performed by analysis circuitry 162 can include measuring (e.g., sensing) voltage values of the voltage at node 132 during a time interval (e.g., test time interval) of the analysis operation (e.g., test operation). analysis circuitry 162 can provide (e.g., generate) information (e.g., measurement information) Test_Info_132, which can include voltage values based on the measured (e.g., collected) voltage values from node 132. Thus, information Test_Info_132 can include an analog voltage signal.

Analysis controller 160 can initiate the analysis operation and activate analysis circuitries 161 and 162 during the analysis operation. Analysis circuitries 161 and 162 can be activated at different times (e.g., activated one at a time). For example, analysis circuitry 161 can be activated to provide information Test_Info_131 based on testing of ESD protection circuit 151 at node 131. After completion of testing ESD protection circuit 151, analysis circuitry 162 can be activated to provide information Test_Info_132 based on testing of ESD protection circuit 152 at node 132. Alternatively, analysis circuitries 161 and 162 can be activated concurrently (e.g. activated at the same time) to test ESD protection circuits 151 and 152 based on operations of analysis circuitries 161 and 162, respectively. Analysis controller 160 can provide control information (e.g., control signals and clock signals) to control operations of analysis circuitries 161 and 162 during the analysis operation.

Analysis controller 160 can include a circuit (e.g., a collection circuit) 164 that can provide (e.g., generate) information (e.g., test result information) Test_Result. Circuit 164 can be shared by analysis circuitries 161 and 162 (and by other analysis circuitries (not shown) coupled to other I/O terminals of IC 101). Thus, Test_Result is based on information Test_Info_131 or Test_Info_132, depending on which of analysis circuitries 161 and 162 is activated to test a corresponding ESD protection circuit (e.g., ESD protection circuit 151 or 152). For example, information Test_Result can be generated based on information Test_Info_131 (e.g., excluding information Test_Info_132) during testing of 151 at node 131. In another example, information Test_Result can be generated based on information Test_Info_132 (e.g., excluding information Test_Info_131) during testing of ESD protection circuit 152 at node 132.

Test_Result can be digital information (which can include multiple bits). For example, circuit 164 can include an analog-to-digital converter (ADC) 165 to provide information Test_Result at the output of ADC 165 based on information Test_Info_131 or Test_Info_132. Thus, ADC 165 can be shared by analysis circuitries 161 and 162 (and by other analysis circuitries (not shown) coupled to other I/O terminals of IC 101). Information Test_Result can be used to generate a record (not shown) that can be a list, a graph, or other form of information associated with testing of ESD protection circuits 151 and 152. The record generated based on information Test_Result can indicate the condition of diodes D1 and D2 of ESD protection circuits 151 and 152, such as whether diode D1 and D2 of ESD protection circuits 151 and 152 operate as expected or have structural damage. Thus, the record generated based on information Test_Result can be used to make adjustment or improvement on ESD protection circuits (e.g., ESD protection circuits 151 and 152) or other circuits of IC 101. The inclusion of analysis controller 160 and analysis circuitries 161 and 162 in IC 101 can help improve the performance of ESD protection circuits 151 and 152, reduce device defect rate of IC 101, and reduce EOS.

Figure 2:
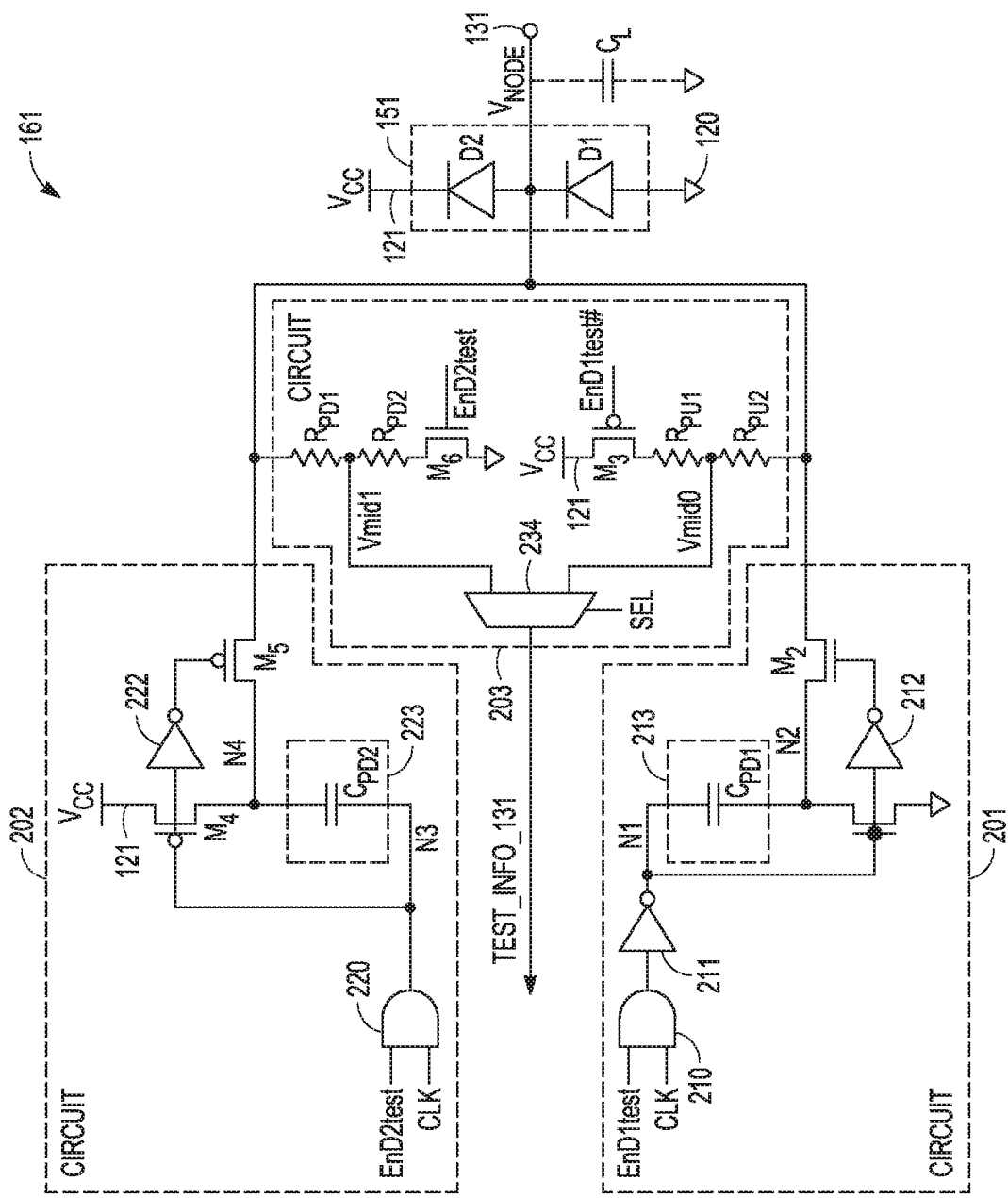
FIG. 2 shows a schematic diagram of one of the analysis circuitry of FIG. 1, according to some embodiments described herein.

FIG. 2 shows a schematic diagram of analysis circuitry 161 of FIG. 1, according to some embodiments described herein. For simplicity, the description herein describes detailed components and operation of analysis circuitry 161 (shown in FIG. 1 and FIG. 2). Analysis circuit 162 (FIG. 1) can have similar components and operations as those of analysis circuitry 161 described below with reference to FIG. 7.

As shown in FIG. 2, analysis circuitry 161 can include circuits 201, 202, and 203 coupled to ESD protection circuit 151 and node 131. FIG. 2 shows a capacitor $C_L$ to represent the capacitance (e.g., load capacitance or node capacitance) of node 131. Capacitor $C_L$ may not be an actual (e.g., discrete) capacitor. A voltage $V_{NODE}$ indicates the voltage at node 131 during an analysis operation (e.g., a test operation) to analyze (e.g., test) ESD protection circuit 151. The value of voltage $V_{NODE}$ depends on the capacitance at node 131 (e.g., the capacitance of capacitor $C_L$). Analysis circuitry 161 can perform an operation (which can be part of a test operation) to measure (e.g., collect) voltage values of voltage $V_{NODE}$ at node 131 during a time interval (e.g., test time interval). The measured (e.g., collected) voltage values can be provided as (e.g., included in) information Test_Info_131.

In FIG. 2, signals (e.g., control signals) EnD1test, EnD1test# (which can be a complement of signal EnD1test), EnD2test, and clock signal CLK (e.g., clock signal for use during a test operation) can be provided by analysis controller 160 (FIG. 1). Information Test_Info_131 provided (e.g., generated) by analysis circuitry 161 can be sent to analysis controller 160 for generating information Test_Result (as mentioned above with reference to the description of FIG. 1).

In FIG. 2, circuit 201 of analysis circuitry 161 can be used (e.g., activated) during one stage (e.g., D1 test stage) to test diode D1. Circuit 202 can be used (e.g., activated) during another stage (e.g., D2 test stage) to test diode D2. Diode D1 and diode D2 can be tested one at a time. Thus, circuits 201 and 202 can be activated one at a time to test a respective diode (either diode D1 or diode D2) at node 131. Circuit 203 can be used to provide information Test_Info_131 based on either the operation of circuit 201 or the operation of circuit 202, depending on which of circuits 201 and 202 is activated. Diodes D1 and D2 can be tested in any order. For example, diode D1 can be tested before diode D2 is tested. In another example, diode D2 can be tested before diode D1 is tested. Thus, circuits 201 and 202 can be activated in any order to test the respective diode (either diode D1 or diode D2) at node 131. During activation of circuit 201 to test diode D1, circuit 202 can be deactivated. During activation of circuit 202 to test diode D2, circuit 201 can be deactivated.

As shown in FIG. 2, circuit 201 can include a logic gate (e.g., AND gate) 210, inverters 211 and 212, a charge pump 213 including a capacitor (e.g., charging capacitor) $C_{PD1}$, and transistors $M_1$ and $M_2$. Circuit 201 can include a node N1 coupled to one plate (e.g., top plate) of capacitor $C_{PD1}$ and a node N2 coupled to another plate (e.g., bottom plate) of capacitor $C_{PD1}$. Circuit 201 can receive signal EnD1test and clock signal CLK. Circuit 201 can be activated (e.g., enabled) to test diode D1 by activating signal EnD1test. For example, signal EnD1test can be activated by causing signal EnD1test to switch from one level (e.g., a low level that can correspond to ground 0V) to another level (e.g., a high level that can correspond to voltage $V_{CC}$). Testing of diode D1 (while circuit 201 is activated) can be performed during multiple periods (cycles) of clock signal CLK.

Circuit 202 can include a logic gate (e.g., AND gate) 220, inverter 222, a charge pump 223 including a capacitor (e.g., charging capacitor) $C_{PD2}$, and transistors $M_4$ and $M_5$. Circuit 202 can include a node N4 coupled to one plate (e.g., top plate) of capacitor $C_{PD2}$ and a node N3 coupled to another plate (e.g., bottom plate) of capacitor $C_{PD2}$. Circuit 202 can receive signal EnD2test and clock signal CLK. Circuit 202 can be activated (e.g., enabled) to test diode D2 by activating signal EnD2test. For example, signal EnD2test can be activated by causing signal EnD2test to switch from one level (e.g., a low level that can correspond to ground 0V) to another level (e.g., a high level that can correspond to voltage $V_{CC}$). Testing of diode D2 (while circuit 202 is activated) can be performed during multiple periods (cycles) of clock signal CLK.

Circuit 203 can include resistors (e.g., pullup resistors) $R_{PU1}$ and $R_{PU2}$, resistors (e.g., pulldown resistors) $R_{PD1}$ and $R_{PD2}$, transistors $M_3$ and $M_6$, and a selector (e.g., multiplexor) 234. Circuit 203 can operate during testing of diode D1 to provide information Test_Info_131 that includes information (e.g., voltage values) associated with testing of diode D1. Circuit 203 can also operate during testing of diode D2 to provide information Test_Info_131 that includes information (e.g., voltage values) associated with testing of diode D2.

Figure 3:
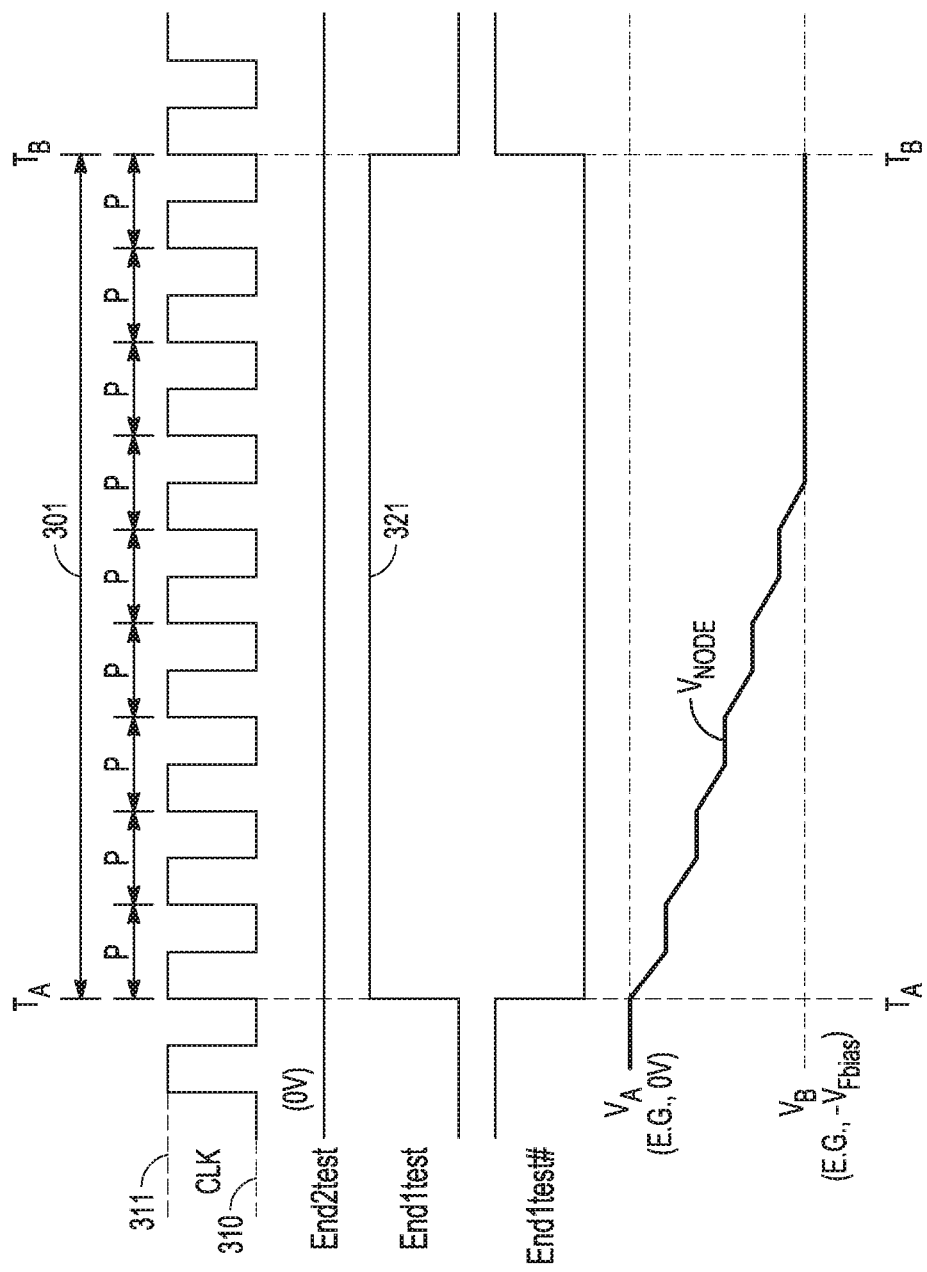
FIG. 3 is a timing diagram showing waveforms of some signals of the analysis circuitry of FIG. 2 including voltage values of a voltage at an I/O node during a stage to test a diode coupled to the I/O node, according to some embodiments described herein.
Figure 4:
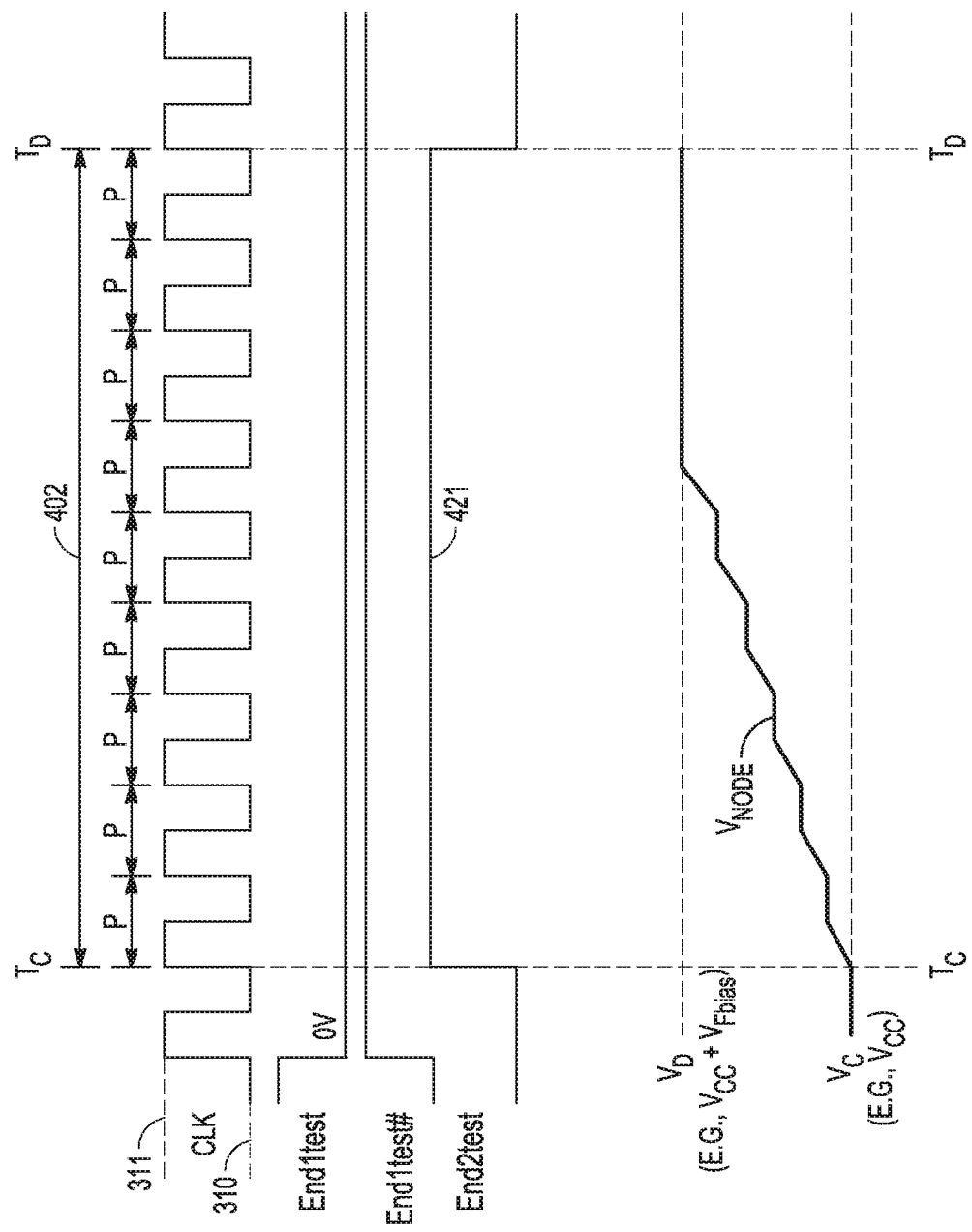
FIG. 4 is a timing diagram showing waveforms of some signals of the analysis circuitry of FIG. 2 including voltage values of the voltage at the I/O node during a stage to test another diode coupled to the I/O node, according to some embodiments described herein.

FIG. 3 and FIG. 4 are timing diagrams of the waveforms of signals of FIG. 2 associated with operations of circuit 201 and 203, respectively. The operation of circuit 201 (to test diode D1) is described below with reference to FIG. 2 and FIG. 3. The operation of circuit 202 (to test diode D2) is described below with reference to FIG. 2 and FIG. 4 (after the description of the operation of circuit 201).

FIG. 3 is a timing diagram showing waveforms of some signals of analysis circuitry 161 and voltage values of voltage $V_{NODE}$ at node 131 during activation of circuit 201 in a stage to test diode D1 of FIG. 2, according to some embodiments described herein. As shown in FIG. 3, clock signal CLK can have a period (cycle) P and can switch between a level 310 (e.g., 0V) and a level 311 (e.g., $V_{CC}$). A time interval 301 indicates a time interval between time $T_A$ and time $T_B$. Time $T_A$ occurs before time $T_B$. For example, times $T_A$ and $T_B$ can indicate the beginning and the end, respectively, of the test operation to test diode D1.

As shown in FIG. 3, time interval 301 can correspond to multiple periods of clock signal CLK (e.g., nine periods of clock signal CLK in the example of FIG. 3). Signal EnD2test can be deactivated (e.g., held at 0V) during time interval 301 to deactivate circuit 202 during time interval 301 (e.g., during activation of circuit 201 in FIG. 2) when diode D1 is tested by circuit 201 (FIG. 2). Signal EnD1test (as shown in FIG. 3) can be activated (e.g., can be held at level 311 (e.g., $V_{CC}$) during time interval 301 to activate circuit 201 during time interval 301. FIG. 2 shows signal EnD1test# being an opposite of signal EnD1test. Voltage $V_{NODE}$ (the voltage at node 131 in FIG. 2) can gradually decrease (e.g., a negative slope) with respect to time. For example, voltage $V_{NODE}$ can have a voltage value of $V_A$ at time $T_A$ and voltage $V_B$ (less than voltage $V_A$) at time $T_B$. Voltage $V_A$ can be 0V. Voltage $V_B$ can be less than 0V (a negative voltage) that can be based on (e.g., equal to) a voltage $V_{Fbias}$ (e.g., $V_{Fbias}$ is the forward bias voltage of diode D1).

The following description refers to FIG. 2 and FIG. 3 and describes the operation of circuit 201 and 203 to test diode D1. When signal EnD1test is set (e.g., at time $T_A$ in FIG. 3) to level 311, voltage $V_{NODE}$ is driven to a negative voltage value (less than 0V) using charge pump 213 (e.g., capacitor $C_{PD1}$) of circuit 201 and the transitions (e.g., the oscillations) of clock signal CLK. With each transition of clock signal CLK, charge pump 213 provides (e.g., pumps) incremental charge to capacitor $C_L$ at node 131. As described above, capacitor $C_L$ in FIG. 3 can simply be the capacitance at node 131. To keep the area of circuit 201 relatively small, the size (e.g., capacitance) of capacitor $C_{PD1}$ (of charge pump 213) of circuit 201 can be selected to be much smaller than the size (e.g., the capacitance) of capacitor $C_L$ (which corresponds to the capacitance of node 131). The number of cycles (e.g., charging cycles) needed to charge capacitor $C_L$ depends on the size of capacitor $C_{PD1}$ and the frequency of clock signal CLK.

During time interval 301 of testing of diode D1, when clock signal CLK is at level 310, transistor $M_1$ is turned on, transistor $M_2$ is turned off, and capacitor $C_{PD1}$ can be charged to voltage $+V_{CC}$. Thus, node N1 can be charged to $+V_{CC}$, and node N2 can be charged to ground through transistor $M_1$.

When clock signal CLK switches from level 310 to level 311 (e.g., during a rising edge of clock signal CLK), the voltage at node N2 can make a transition to voltage $-V_{CC}$. When clock signal CLK is at level 311, transistor $M_1$ is turned off, and transistor $M_2$ is turned on and incrementally discharges capacitor $C_L$ (e.g., discharges node 131). Thus, after each period P of clock signal CLK, the charge at node 131 slowly decreases and eventually saturates to a steady state value. As shown in FIG. 3, the value of voltage $V_{NODE}$ (which has a value based on the charge at node 131) can change (e.g., decrease from voltage value $V_A$ to voltage value $V_B$ (e.g., steady state voltage value) after each period P of clock signal CLK. Since the size of capacitor $C_{PD1}$ can be smaller than the size of capacitor $C_L$, it can take multiple periods of clock signal CLK for the value of voltage $V_{NODE}$ to reach a steady state voltage value (e.g., voltage value $V_B$ in FIG. 3). Thus, the number of periods in which that voltage $V_{NODE}$ reaches a steady state voltage value can be based on the capacitances of capacitors $C_L$ and $C_{PD1}$.

During time interval 301, circuit 203 can operate to provide information Test_Info_131 based on the value of voltage $V_{NODE}$ during time interval 301. During time interval 301, signal SEL can have a value (e.g., binary 0) to cause selector 234 to pass signal Vmid0 to the output of selector 234 to be included in information Test_Info_131 during time interval 301. The value (voltage value) of signal Vmid0 is based on the voltage value of voltage $V_{NODE}$ during time interval 301. During time interval 301, voltage $V_{NODE}$ can be level shifted to a nominal signal voltage range between 0 and $V_{CC}$ through resistors $R_{PU1}$ and $R_{PU2}$ to provide voltages (e.g., detection voltages) that can be included in information Test_Info_131. Since the range of voltage $V_{NODE}$ can be between $V_{CC}$ and 0V, the values of resistors $R_{PU1}$ and $R_{PU2}$ can be selected accordingly so that the value of signal Vmid0 (the level shifted voltage) can fall in the normal signal range between 0 and $V_{CC}$. During time interval 301, the value (e.g., voltage value) of information Test_Info_131 is based on the value of signal Vmid0.

As described above with reference to FIG. 1, information Test_Info_131 can be used to generate (e.g., generated by circuit 164 of FIG. 1) information Test_Result. In the operation of circuit 201 and 203 to test diode D1 of analysis circuitry 161 during time interval 301 (FIG. 3), information Test_Result can be used to analyze diode D1 of ESD protection circuit 151. For example, information Test_Result generated based on signal Vmid0 can be compared with a baseline value for a known good diode to determine the integrity of diode D1 and its connection between node 131 and ground node 120.

FIG. 4 is a timing diagram showing waveforms of some signals of analysis circuitry 161 and voltage values of voltage $V_{NODE}$ at node 131 during activation of circuit 202 in a stage to test diode D2 of FIG. 2, according to some embodiments described herein. As shown in FIG. 4, clock signal CLK can have a period P. A time interval 402 indicates a time interval between time $T_C$ and time $T_D$. Time $T_C$ occurs before time $T_D$. For example, times $T_C$ and $T_D$ can indicate the beginning and the end, respectively, of the test operation to test diode D2. As mentioned above, diodes D1 and D2 can be tested in any order (e.g., testing diode D2 after testing diode D1, or testing diode D1 before testing diode D2). Thus, time interval 402 in FIG. 4 can occur either after time interval 301 (FIG. 3) or before time interval 301.

The following description refers to FIG. 2 and FIG. 4 and describes the operation of circuit 202 and 203 to test diode D2. When signal EnD2test is set (e.g., at time $T_C$ in FIG. 4) to level 421 during time interval 402, voltage $V_{NODE}$ is driven towards $2*V_{CC}$ (two times $V_{CC}$) using charge pump 223 (e.g., capacitor $C_{PD2}$) of circuit 202 and the transitions (e.g., the oscillations) of clock signal CLK. When clock signal CLK is at level 310, transistor $M_4$ is turned on, transistor $M_5$ is turned off, and capacitor $C_{PD2}$ can be charged to voltage $+V_{CC}$. Thus, node N4 can be charged to $+V_{CC}$ through transistor $M_4$, and node N3 can be charged to ground.

When clock signal CLK switches from level 310 to level 311 (e.g., during a rising edge of clock signal CLK), the voltage at node N4 can go to $2*V_{CC}$. When clock signal CLK is at level 311, transistor $M_4$ is turned off, and transistor $M_5$ is turned on and incrementally charges capacitor $C_{PD2}$ (e.g., charge node 131) to a higher voltage. In the presence of diode D2, voltage $V_{NODE}$ can be limited to $V_{CC}+V_{Fbias}$ (e.g., $V_{Fbias}$ is the forward bias voltage of diode D2). Thus, after each period P of clock signal CLK, the charge at node 131 slowly increases and eventually saturates to a steady state value. As shown in FIG. 4, the value of voltage $V_{NODE}$ (which has a value based on the charge at node 131) can change (e.g., increase from voltage value $V_C$ to voltage value VD (e.g., steady state voltage value) after each period P of clock signal CLK. To keep the area of circuit 202 relatively small, the size (e.g., capacitance) of capacitor $C_{PD2}$ (of charge pump 223) of circuit 202 can be selected to be a much smaller than the size (e.g., the capacitance) of capacitor $C_L$ (which corresponds to the capacitance of node 131). Thus, as shown in FIG. 4, it can take multiple periods of clock signal CLK for the value of voltage $V_{NODE}$ to reach a steady state voltage value (e.g., voltage value VD in FIG. 4). Thus, the number of periods in which that voltage $V_{NODE}$ reaches a steady state voltage value can be based on the capacitances of capacitors $C_L$ and $C_{PD2}$.

During time interval 402, circuit 203 can operate to provide information Test_Info_131 based on the value of voltage $V_{NODE}$ during time interval 402. During time interval 402, signal SEL can have a value (e.g., binary 1) to cause selector 234 to pass signal Vmid1 to the output of selector 234 to be included in information Test_Info_131 during time interval 402. The value (voltage value) of signal Vmid1 is based on the voltage value of voltage $V_{NODE}$ during time interval 402. During time interval 402, voltage $V_{NODE}$ can be level shifted to a nominal signal voltage range between 0 and $V_{CC}$ through resistors $R_{PD1}$ and $R_{PD2}$ to provide voltages (e.g., detection voltages) that can be included in information Test_Info_131. Since the range of voltage $V_{NODE}$ can be between $V_{CC}+V_{Fbias}$ and 0V, the values of resistors $R_{PD1}$ and $R_{PD2}$ can be selected accordingly so that the value of signal Vmid1 (the level shifted voltage) can fall in the normal signal range between 0 and $V_{CC}$. During time interval 402, the value (e.g., voltage value) of information Test_Info_131 is based on the value of signal Vmid1.

As described above with reference to FIG. 1, information Test_Info_131 can be used to generate (e.g., generated by circuit 164 of FIG. 1) information Test_Result. In the operation of circuit 202 and 203 to test diode D2 of analysis circuitry 161 during time interval 402 (FIG. 4), information Test_Result can be used to analyze diode D2 of ESD protection circuit 151. For example, information Test_Result generated based on signal Vmid1 can be compared with a baseline value for a known good diode to determine the integrity of diode D2 and its connection between node 131 and supply node 121.

The components of analysis circuitry 161 as shown in FIG. 2 can have a relatively small area. Thus, analysis circuitry 161 and other analysis circuits (e.g., analysis circuitry 161 and similar circuitries) can be suitable to be incorporated in IC 101 with minimal or no disturbance to I/O functionality of IC 101. The frequency of clock signal CLK can be traded with test time. For example, a larger number of clock periods may be used to allow the charge pump 223 to build voltage $V_{NODE}$ at node 131 if clock signal CLK has a relatively lower frequency, and fewer clock periods may be used to allow charge pump 223 to build voltage $V_{NODE}$ at node 131 if clock signal CLK has a relatively higher frequency. As mentioned above with reference to FIG. 1, analysis circuitry 161 can be deactivated during normal operation of IC 101. For example, in FIG. 2, transistors $M_2$, $M_3$, $M_5$ and $M_6$ can be turned off to electrically isolate analysis circuitry 161 from node 131, such that analysis circuitry 161 may not be intrusive to normal operation of IC 101 (e.g., operations of 141, which is coupled to node 131).

Figure 5:
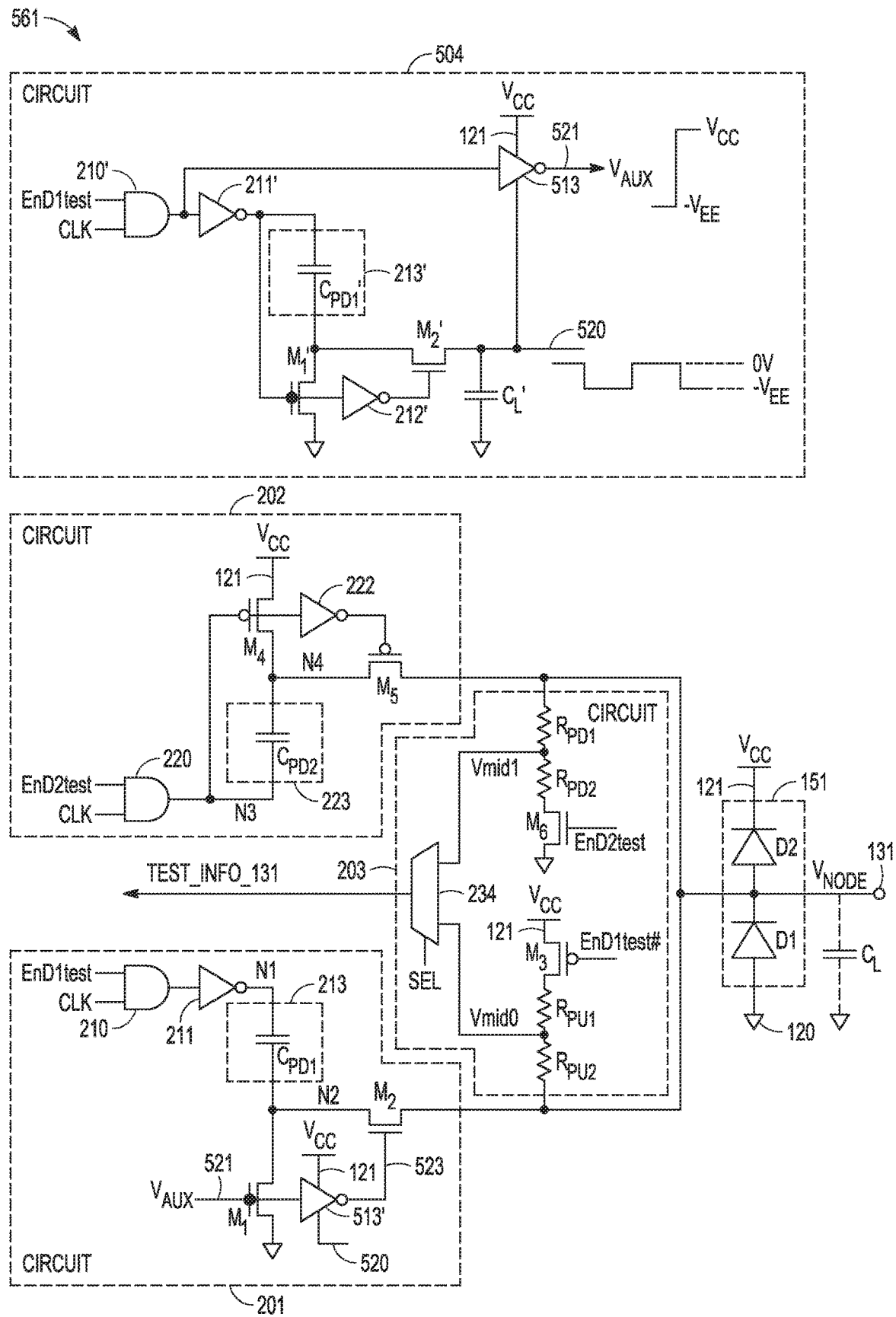
FIG. 5 shows a schematic diagram of analysis circuitry, which can be a variation of the analysis circuitry of FIG. 2, according to some embodiments described herein.

FIG. 5 shows a schematic diagram of analysis circuitry 561, which can be a variation of analysis circuitry 161 of FIG. 2, according to some embodiments described herein. As described above with reference to FIG. 1 and FIG. 2, analysis circuitries 161 and 162 can have similar components (e.g., structures) and operations. Thus, analysis circuitry 561 can be used in IC 101 as each of analysis circuitries 161 and 162. As shown in FIG. 5, analysis circuitry 561 can have similar components as analysis circuitry 161. Thus, for simplicity, similar and identical components in analysis circuitries 161 and 561 are given the same labels and their description is not repeated.

Differences between analysis circuitry 561 (FIG. 5) and analysis circuitry 161 (FIG. 2) include the addition of circuit 504 in FIG. 5. Circuit 504 includes a logic gate (e.g., AND gate) 210', inverters 211', 212', and 513, a charge pump 213' including a capacitor (e.g., charging capacitor) $C_{PD1}'$, transistors $M_1'$ and $M_2'$, and a capacitor $C_L'$ (which is an actual transistor, unlike capacitor $C_L$ of circuit 201). Circuit 504 can receive signal EnD1test and clock signal CLK. Circuit 504 can include a node 520 that can have a voltage signal switching between 0V and $-V_{EE}$ ($-V_{EE}$ is a negative voltage). Circuit 504 can include a node 521 to provide a signal $V_{AUX}$ (voltage signal) that can have a value between $-V_{EE}$ and $V_{CC}$.

As shown in FIG. 5, node 521 can be electrically coupled to the gate of transistor $M_1$ of circuit 201. Thus, transistor $M_1$ can be controlled (e.g., turned on or turned off) by signal $V_{AUX}$.

Node 520 of circuit 504 can be electrically coupled to inverter 513' of circuit 201, such that the output node of inverter 513' coupled to node 523 can switch between $-V_{EE}$ and $V_{CC}$. The gate of transistor $M_2$ can be coupled to node 523. Thus, transistor $M_2$ can be controlled (e.g., turned on or turned off) by the voltage signal at node 523 (which can switch between $-V_{EE}$ or $V_{CC}$).

Circuit 504 may enhance the operation of analysis circuitry 561 in comparison with the operation of analysis circuitry 161. For example, as described above with reference to FIG. 2 and FIG. 3 regarding the operation of circuit 201 of analysis circuitry 161, transistor $M_1$ in FIG. 2 may leak charge when it is in the turned-off state, and transistor $M_2$ may leak charge when it is in the turned-off state. Node 131 in FIG. 2 may not be charged to a substantially negative voltage (e.g., $-V_{CC}$) due to such charge leakage. For example, node 131 in FIG. 2 may be charged to approximately $-0.3V$ or $-0.4V$ (which is less negative than $-V_{CC}$), depending on process, voltage, and temperature (PVT) associated with fabrication and operating conditions of analysis circuitry 161.

In FIG. 5, the addition of circuit 504 may prevent transistors $M_1$ and $M_2$ from leaking charge when they are in the turned-off state. For example, circuit 504 can help level shift the voltage at the gates of transistors $M_1$ and $M_2$ to be less than 0V (e.g., a negative voltage $-V_{EE}$) when transistors $M_1$ and $M_2$ are in the turned-off state. The negative voltage (e.g., $-V_{EE}$) can help completely (e.g., fully) turned off transistors $M_1$ and $M_2$ to prevent charge leakage when transistors $M_1$ and $M_2$ are in the turned-off state.

In the presence of diode D1 between node 131 and ground node 120 in FIG. 5, the negative voltage at node 131 can cause diode D1 to be forward biased and cause charging current to be shunted through diode D1. Thus, voltage $V_{NODE}$ (e.g., steady state voltage) at node 131 during testing of diode D1 in FIG. 5 can be close to the forward bias voltage ($V_{Fbias}$) of diode D1.

In the operation of circuit 504, the negative voltage (e.g., $-V_{EE}$) is applied to the gate of transistors $M_1$ and $M_2$ during one-half (½) phase of clock signal CLK when transistors $M_1$ and $M_2$ are in the turned-off state. Thus, capacitors $C_{PD1}$ and $C_{PD1}'$ can be relatively small.

Voltage $-V_{EE}$ generated by circuit 504 may be used to supply charging and discharging currents for relatively small transistor gate capacitance (e.g., capacitance at the gates of transistors $M_1$ and $M_2$). Thus, circuit 504 can be shared among multiple analysis circuitries (which can be similar to analysis circuitry 561) of an IC (e.g., IC 101 in FIG. 1). For example, circuit 504 can be shared by analysis circuitries of an IC (e.g., IC 101 in FIG. 1) to control transistors (which can be similar to transistors $M_1$ and $M_2$ of analysis circuitry 561) in such analysis circuitries. Such sharing can reduce the area overhead of the overall analysis structure (e.g., test structure) of the IC.

Figure 5A:
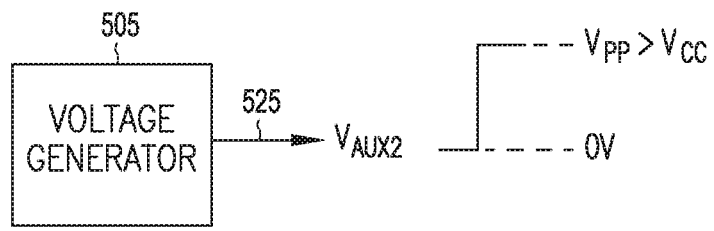
FIG. 5A shows a block diagram of a voltage generator that can be included in the analysis circuitry of FIG. 2 or the analysis circuitry of FIG. 5, according to some embodiments described herein.

FIG. 5A shows a block diagram of a voltage generator 505 that can be included in analysis circuitry 161 of FIG. 2 or analysis circuitry 561 of FIG. 5, according to some embodiments described herein. Voltage generator 505 can generate a signal (a voltage signal) $V_{AUX2}$ at a node 525. Signal $V_{AUX2}$ can have a value between 0 and $V_{PP}$, where $V_{PP}$ is greater than voltage $V_{CC}$ (e.g., $V_{PP} > V_{CC}$). Voltage generator 505 can be included in analysis circuitry 161 (FIG. 2) or analysis circuitry 561 (FIG. 5). Voltage generator 505 can be used as part of analysis circuitry 161 during testing of diode D2 of FIG. 2 or as part of analysis circuitry 561 during testing of diode D2 of FIG. 5. For example, when voltage generator 505 is included in analysis circuitry 161 of FIG. 2, signal $V_{AUX2}$ generated by voltage generator 505 can be used to control the gates of transistors $M_4$ and $M_5$ during activation of circuit 202 (e.g., during time $T_C$ and $T_D$ in FIG. 4, while circuit 201 is deactivated) to test diode D2 (FIG. 2 or FIG. 5).

Including voltage generator 505 (FIG. 5) in analysis circuitry 161 (FIG. 2) may enhance the operation of analysis circuitry 161. For example, transistor $M_4$ of analysis circuitry 161 in FIG. 2 may leak charge when it is in the turned-off state, and transistor $M_5$ of analysis circuitry 161 in FIG. 2 may leak charge when it is in the turned-off state. During testing of diode D2 of FIG. 2, node 131 in FIG. 2 may not be charged to a substantially higher voltage than $V_{CC}$ due to such charge leakage. Thus, transistor $M_4$ may not be fully turned off when it is the turned-off state, and transistor $M_5$ may not be fully turned off when it is in the turned-off state. The inclusion of voltage generator 505 in FIG. 2 may prevent transistors $M_4$ and $M_5$ in FIG. 2 from leaking charge when they are in the turned-off state during testing of diode D2 of FIG. 2. For example, voltage generator 505 can help level shift a voltage at the gates of transistors $M_4$ and $M_5$ to be greater than voltage $V_{CC}$ when transistors $M_4$ and $M_5$ are in the turned-off state. Such a voltage (e.g., $V_{PP} > V_{CC}$) at the gate of transistors $M_4$ and $M_5$ can help completely (e.g., fully) turned off transistors $M_4$ and $M_5$ to prevent charge leakage when transistors $M_4$ and $M_5$ are in the turned-off state, thereby enhancing the operation of analysis circuitry 161.

Similarly, including voltage generator 505 (FIG. 5A) in analysis circuitry 561 (FIG. 5) may enhance the operation of analysis circuitry 561. For example, transistor $M_4$ of analysis circuitry in FIG. 5 may leak charge when it is in the turned-off state, and transistor $M_5$ of analysis circuitry in FIG. 5 may leak charge when it is in the turned-off state. During testing of diode D2 of FIG. 5, node 131 in FIG. 5 may not be charged to a substantially higher voltage than $V_{CC}$ due to such charge leakage. Thus, transistor $M_4$ may not be fully turned off when it is the turned-off state, and transistor $M_5$ may not be fully turned off when it is in the turned-off state. The inclusion of voltage generator 505 in FIG. 5 may prevent transistors $M_4$ and $M_5$ in FIG. 5 from leaking charge when they are in the turned-off state during testing of diode D2 of FIG. 5. For example, voltage generator 505 can help level shift a voltage at the gates of transistors $M_4$ and $M_5$ to be greater than voltage $V_{CC}$ when transistors $M_4$ and $M_5$ are in the turned-off state. Such a voltage (e.g., $V_{PP} > V_{CC}$) at the gate of transistors $M_4$ and $M_5$ can help completely (e.g., fully) turned off transistors $M_4$ and $M_5$ to prevent charge leakage when transistors $M_4$ and $M_5$ are in the turned-off state, thereby enhancing the operation of analysis circuitry 561.

Figure 6:
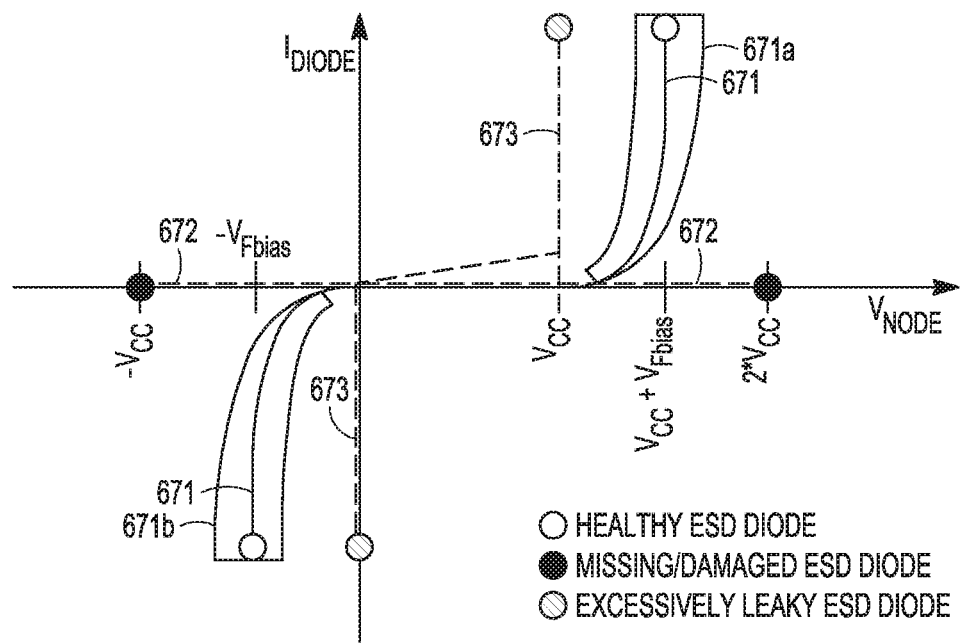
FIG. 6 shows a graph showing different I-V curves that can represent different possible statuses of a diode of an ESD protection circuit after an analysis operation performed on the node coupled to the diode, according to some embodiments described herein.

FIG. 6 shows a graph showing curves (I-V curves) 671, 672, and 673 that can represent different possible statuses (e.g., conditions) of a diode of an ESD protection circuit 151 after an analysis operation performed on the node coupled to the diode, according to some embodiments described herein. The diode discussed with reference to FIG. 6 can be diode D1 or diode D2 of ESD protection circuit 151, 162 (FIG. 2) or 561 (FIG. 5). Current at diode in FIG. 6 can be the current flowing through diode D1 or diode D2 of ESD protection circuit 151, 162 (FIG. 2) or 561 (FIG. 5) during an analysis operation. FIG. 6 also shows regions (e.g., acceptable margin regions) 671a and 671b to indicate that curve 671 fluctuates within regions 671a and 671b.

Each of curves 671, 672, and 673 can be generated based on information Test_Result (FIG. 1) resulting from testing diode D1 or diode D2 of ESD protection circuits 151 and 152 (FIG. 2), as described above. Thus, the status of a particular diode (e.g., D1 or D2) being tested can be determined by observing the curve (e.g., one of curves 671, 672, and 673) generated based on information Test_Result associated with that particular diode.

For example, if curve 671 is generated based on information Test_Result associated with testing of diode D1 of ESD protection circuit 151 (FIG. 2), then diode D1 can be determined to be a healthy diode (e.g., healthy ESD diode). In another example, if curve 672 is generated based on information Test_Result associated with testing of diode D1 of ESD protection circuit 151 (FIG. 2), then diode D1 of ESD protection circuit 151 can be determined to be missing or damaged (e.g., malfunctioned). In another example, if curve 673 is generated based on information Test_Result associated with testing of diode D1 of ESD protection circuit 151 (FIG. 2), then diode D1 of ESD protection circuit 151 can be determined to be excessively leaky (e.g., diode D1 is not completely turned off during the turned-off state of diode D1). Based on curves 671, 672, and 673, adjustment or improvement on the components (e.g., diode D1, D2, or both) of ESD protection circuits (e.g., ESD protection circuits 151 and 152) can be made.

Figure 7:
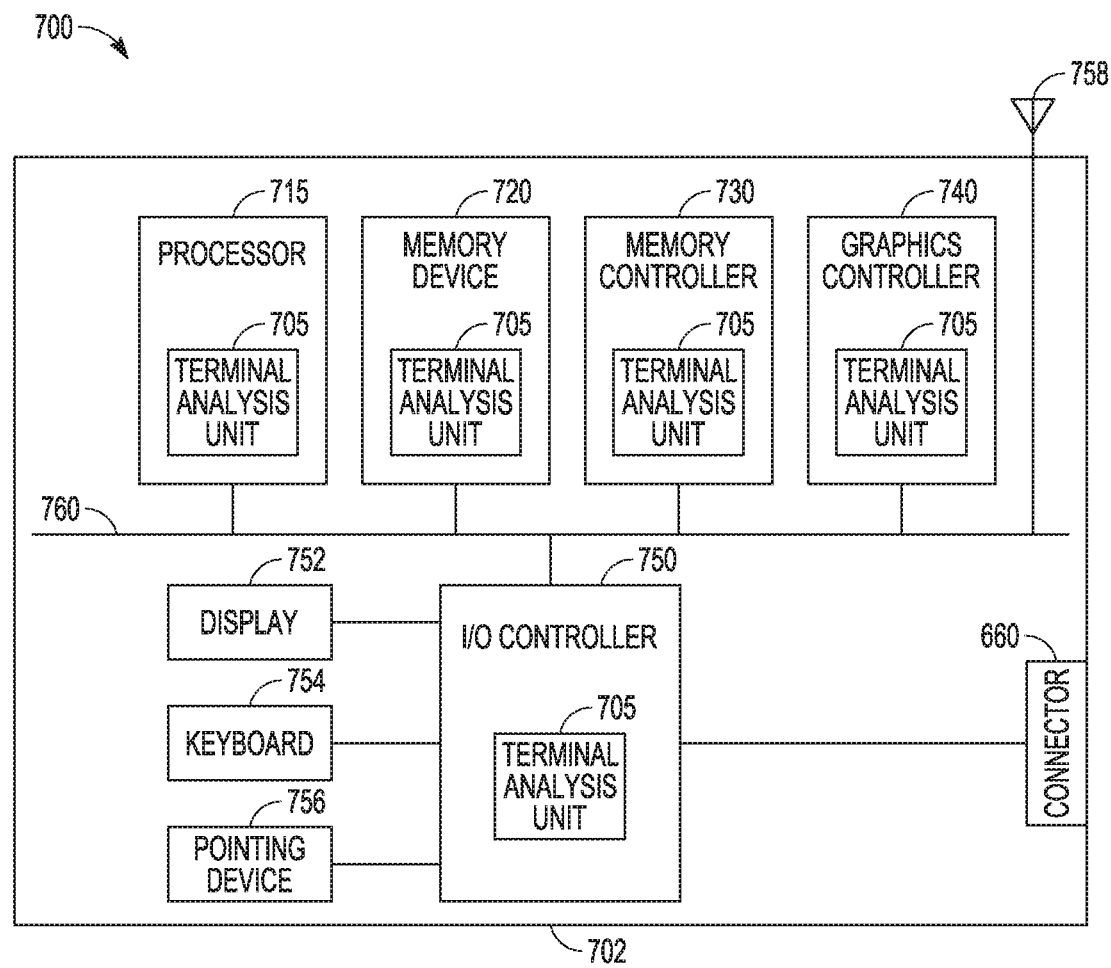
FIG. 7 shows an apparatus in the form of a system, according to some embodiments described herein.

FIG. 7 shows an apparatus in the form of a system (e.g., electronic system) 700, according to some embodiments described herein. System 700 can include or be included in a computer, a tablet, or other electronic system. As shown in FIG. 7, system 700 can include components located on a circuit board (e.g., printed circuit board (PCB)) 702, such as a processor 715, a memory device 720, a memory controller 730, a graphics controller 740, an I/O controller 750, a display 752, a keyboard 754, a pointing device 756, at least one antenna 758, a connector 755, and a bus 760. Bus 760 can include conductive lines (e.g., metal-based traces on a circuit board 702 where the components of system 700 are located).

In some arrangements, system 700 does not have to include a display. Thus, display 752 can be omitted from system 700. In some arrangements, system 700 does not have to include any antenna. Thus, antenna 758 can be omitted from system 700. In some arrangements, system 700 does not have to include a connector. Thus, connector 755 can be omitted from system 700.

Processor 715 can include a general-purpose processor or an application specific integrated circuit (ASIC). Processor 715 can include a CPU.

Memory device 720 can include a dynamic random access memory (DRAM) device, a static random access memory (SRAM) device, a flash memory device, phase change memory, a combination of these memory devices, or other types of memory. FIG. 7 shows an example where memory device 720 is a stand-alone memory device separated from processor 715. In an alternative arrangement, memory device 720 and processor 715 can be located on the same die. In such an alternative arrangement, memory device 720 is an embedded memory in processor 715, such as embedded DRAM (eDRAM), embedded SRAM (eSRAM), embedded flash memory, or another type of embedded memory.

Display 752 can include a liquid crystal display (LCD), a touchscreen (e.g., capacitive or resistive touchscreen), or another type of display. Pointing device 756 can include a mouse, a stylus, or another type of pointing device.

I/O controller 750 can include a communication module for wired or wireless communication (e.g., communication through one or more antenna 758). Such wireless communication may include communication in accordance with WiFi communication techniques, Long Term Evolution Advanced (LTE-A) communication techniques, or other communication techniques.

I/O controller 750 can also include a module to allow system 700 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 755 can be arranged (e.g., can include terminals, such as pins) to allow system 700 to be coupled to an external device (or system). This may allow system 700 to communicate (e.g., exchange information) with such a device (or system) through connector 755. Connector 755 and at least a portion of bus 760 can include conductive lines that conform with at least one of USB, DP, HDMI, Thunderbolt, PCIe, Ethernet, and other specifications.

As shown in FIG. 7, each of processor 715, memory device 720, memory controller 730, graphics controller 740, and I/O controller 750 can include a terminal analysis unit 705, which can include terminal analysis unit 167 described above with reference to FIG. 1 through FIG. 6. FIG. 7 shows each of processor 715, memory device 720, memory controller 730, graphics controller 740, and I/O controller 750 including terminal analysis unit 705, as an example. However, fewer than all of processor 715, memory device 720, memory controller 730, graphics controller 740, and I/O controller 750 can include terminal analysis unit 705.

FIG. 7 shows the components of system 700 arranged separately from each other as an example. For example, each of processor 715, memory device 720, memory controller 730, graphics controller 740, and I/O controller 750 can be located on a separate IC (e.g., semiconductor die 102 or an IC chip). In some arrangements, two or more components (e.g., processor 715, memory device 720, graphics controller 740, and I/O controller 750) of system 700 can be located on the same die (e.g., same IC chip) that forms a system-on-chip (Soc).

The illustrations of the apparatuses (e.g., apparatus 100 and system 700 including IC 101, analysis controller 160, analysis circuitries 161, 162, and 561) and methods (e.g., operations of apparatus 100 and system 400 including operations of analysis controller 160, analysis circuitries 161, 162, and 561) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

ADDITIONAL NOTES AND EXAMPLES

Example 1 includes subject matter (such as a device, an electronic apparatus (e.g., circuit, electronic system, or both), or a machine) including a node, an electrostatic discharge (ESD) protection circuit coupled to the node, a first circuit coupled to the node and including a first charge pump to cause a voltage at the node during activation of the first circuit to change from a first voltage value to a second voltage value within first multiple periods of a clock signal during activation of the first circuit, the second voltage value being less than the first voltage value, a second circuit coupled to the node and including a second charge pump to cause a voltage at the node during activation of the second circuit to change from a third voltage value to a fourth voltage value during second multiple periods of the clock signal during activation of the second circuit, the fourth voltage value being greater than the third voltage value, and a third circuit to generate information based on the second voltage value of the voltage at the node during activation of the first circuit and based on the fourth voltage value of the voltage at the node during activation of the second circuit.

In Example 2, the subject matter of Example 1 may optionally include, wherein the protection circuit includes a first diode coupled between the node and a ground node, and a second diode coupled between the node and a supply node.

In Example 3, the subject matter of Example 1 or 2 may optionally include, wherein the second circuit is to be deactivated during action of the first circuit, and first circuit is to be deactivated during action of the second circuit.

In Example 4, the subject matter of Example 1 or 2 may optionally include, further comprising an analog-to-digital convert to generate additional information based on the information generated by the third circuit.

In Example 5, the subject matter of Example 1 or 2 may optionally include, further comprising a fourth circuit to generate an additional voltage at an additional node, the additional voltage having a negative voltage value, wherein the additional node is coupled to a gate of at least one transistor of the first circuit.

In Example 6, the subject matter of Example 1 or 2 may optionally include, further comprising an additional circuit to generate an additional voltage, the additional voltage having a voltage higher than a supply voltage of the second circuit, wherein the additional voltage is used to control a gate of at least one transistor of the second circuit.

In Example 7, the subject matter of Example 1 may optionally include, wherein the first multiple periods and the second multiple periods have a same number of periods.

In Example 8, the subject matter of Example 1 may optionally include, wherein the first multiple periods and the second multiple periods have different numbers of periods.

In Example 9, the subject matter of Example 1 may optionally include, further comprising a receiver coupled to the node.

In Example 10, the subject matter of Example 8 may optionally include, further comprising a transmitter coupled to the node.

Example 11 includes subject matter (such as a device, an electronic apparatus (e.g., circuit, electronic system, or both), or a machine) including a node, a first diode coupled between the node and a ground node, a second diode coupled between the node and a supply node, a first circuit including a first capacitor, a first transistor coupled between a plate of the first capacitor and the node, and a second transistor coupled between the plate of the first capacitor and the ground node, and a second circuit including a second capacitor, a third transistor coupled between a plate of the second capacitor and the node, and a fourth transistor coupled between the plate of the second capacitor and the ground node.

In Example 12, the subject matter of Example 11 may optionally include, wherein the first circuit includes a logic gate and an inverter coupled between the logic gate and an additional plate of the first capacitor.

In Example 13, the subject matter of Example 12 may optionally include, wherein the second circuit includes an additional logic gate and an additional inverter coupled between the additional logic gate and an additional plate of the second capacitor.

In Example 14, the subject matter of Example 11 may optionally include, wherein the first circuit is to cause the first transistor to turn off when the second transistor is turned on, and to cause the first transistor to turn on when the second transistor is turned off.

In Example 15, the subject matter of Example 14 may optionally include, wherein the second circuit is to cause the third to turn off when the fourth transistor is turned on, and to cause the third transistor is turn on when the fourth transistor is turned off.

In Example 16, the subject matter of Example 11 may optionally include, wherein the first circuit is to receive a clock signal, and the first capacitor is to cause a value of a voltage at the node during first multiple periods of the clock signal to decrease after each period of the first multiple periods of the clock signal.

In Example 17, the subject matter of Example 16 may optionally include, wherein the second circuit is to receive the clock signal, and the second capacitor is to cause a value of a voltage at the node during second multiple periods of the clock signal to increase after each period of the second multiple periods of the clock signal.

In Example 18, the subject matter of Example 11 may optionally include, further comprising a third circuit to generate first information based on a voltage at the node when the first circuit is activated and the second circuit is deactivated, and generate second information based on a voltage at the node when the first circuit is deactivated and the second circuit is activated.

In Example 19, the subject matter of Example 18 may optionally include, wherein the third circuit includes a selector having a first input coupled to the node through a first resistor, a second input coupled to the node through a second resistor, and an output to provide the first and second information.

In Example 20, the subject matter of Example 19 may optionally include, wherein the third circuit includes a first additional resistor coupled between the first input of the selector and a supply node, and a second additional resistor coupled between the second input of the selector and a ground node.

Example 21 includes subject matter such as a device, an electronic apparatus (e.g., circuit, electronic system, or both), or a machine) including a first integrated circuit (IC) chip on a circuit board, a second IC chip on the circuit board and coupled to the first IC chip, at least one of the first and second IC chips including a processor, and at least one of the first and second IC chips including an input/output (I/O) node, an electrostatic discharge (ESD) protection circuit coupled to the input/output node, a first circuit coupled to the I/O node and including a first charge pump to cause a voltage at the I/O node during activation of the first circuit to change from a first voltage value to a second voltage value within first multiple periods of a clock signal during activation of the first circuit, the second voltage value being less than the first voltage value, a second circuit coupled to the I/O node and including a second charge pump to cause a voltage at the I/O node during activation of the second circuit to change from a third voltage value to a fourth voltage value during second multiple periods of the clock signal during activation of the second circuit, the fourth voltage value being greater than the third voltage value, and a third circuit to generate information based on the second voltage value of the voltage at the I/O node during activation of the first circuit and based on the fourth voltage value of the voltage at the I/O node during activation of the second circuit.

In Example 22, the subject matter of Example 21 may optionally include, further comprising a fourth circuit to generate a first additional voltage at an additional node, the first additional voltage having a negative voltage value, wherein the additional node is coupled to a gate of at least one transistor of the first circuit.

In Example 23, the subject matter of Example 22 may optionally include, further comprising a fifth circuit to generate a second additional voltage, the second additional voltage having a voltage greater than a supply voltage of the second circuit, wherein the second additional voltage is used to control a gate of at least one transistor of the second circuit.

In Example 24, the subject matter of any of Examples 21-23 may optionally include, further comprising an antenna coupled to one of the first and second IC chips.

In Example 25, the subject matter of any of Examples 21-23 may optionally include, wherein further comprising a connector coupled to the second device, the connector conforming with one of Universal Serial Bus (USB), High-Definition Multimedia Interface (HDMI), Thunderbolt, Peripheral Component Interconnect Express (PCIe), and Ethernet specifications.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only, B only, or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only, B only, or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a node;
   an electrostatic discharge (ESD) protection circuit coupled to the node;
   a first circuit coupled to the node and including a first charge pump to cause a voltage at the node during activation of the first circuit to change from a first voltage value to a second voltage value within first multiple periods of a clock signal during activation of the first circuit, the second voltage value being less than the first voltage value;
   a second circuit coupled to the node and including a second charge pump to cause a voltage at the node during activation of the second circuit to change from a third voltage value to a fourth voltage value during second multiple periods of the clock signal during activation of the second circuit, the fourth voltage value being greater than the third voltage value; and
   a third circuit to generate information based on the second voltage value of the voltage at the node during activation of the first circuit and based on the fourth voltage value of the voltage at the node during activation of the second circuit.

2. The apparatus of claim 1, wherein the protection circuit includes a first diode coupled between the node and a ground node, and a second diode coupled between the node and a supply node.

3. The apparatus of claim 1, wherein the second circuit is to be deactivated during action of the first circuit, and first circuit is to be deactivated during action of the second circuit.

4. The apparatus of claim 1, further comprising an analog-to-digital convert to generate additional information based on the information generated by the third circuit.

5. The apparatus of claim 1, further comprising a fourth circuit to generate an additional voltage at an additional node, the additional voltage having a negative voltage value, wherein the additional node is coupled to a gate of at least one transistor of the first circuit.

6. The apparatus of claim 1, further comprising an additional circuit to generate an additional voltage, the additional voltage having a voltage greater than a supply voltage of the second circuit, wherein the additional voltage is used to control a gate of at least one transistor of the second circuit.

7. The apparatus of claim 1, wherein the first multiple periods and the second multiple periods have a same number of periods.

8. The apparatus of claim 1, wherein the first multiple periods and the second multiple periods have different numbers of periods.

9. The apparatus of claim 1, further comprising a receiver coupled to the node.

10. The apparatus of claim 9, further comprising a transmitter coupled to the node.

11. An apparatus comprising:
    a first integrated circuit (IC) chip on a circuit board;
    a second IC chip on the circuit board and coupled to the first IC chip, at least one of the first and second IC chips including a processor, and at least one of the first and second IC chips including:
    an input/output (I/O) node;
    an electrostatic discharge (ESD) protection circuit coupled to the input/output node;
    a first circuit coupled to the I/O node and including a first charge pump to cause a voltage at the I/O node during activation of the first circuit to change from a first voltage value to a second voltage value within first multiple periods of a clock signal during activation of the first circuit, the second voltage value being less than the first voltage value;
    a second circuit coupled to the I/O node and including a second charge pump to cause a voltage at the I/O node during activation of the second circuit to change from a third voltage value to a fourth voltage value during second multiple periods of the clock signal during activation of the second circuit, the fourth voltage value being greater than the third voltage value; and
    a third circuit to generate information based on the second voltage value of the voltage at the I/O node during activation of the first circuit and based on the fourth voltage value of the voltage at the I/O node during activation of the second circuit.

12. The apparatus of claim 11, further comprising a fourth circuit to generate a first additional voltage at an additional node, the first additional voltage having a negative voltage value, wherein the additional node is coupled to a gate of at least one transistor of the first circuit.

13. The apparatus of claim 12, further comprising a fifth circuit to generate a second additional voltage, the second additional voltage having a voltage greater than a supply voltage of the second circuit, wherein the second additional voltage is used to control a gate of at least one transistor of the second circuit.

14. The apparatus of claim 11, further comprising an antenna coupled to one of the first and second IC chips.

15. The apparatus of claim 11, further comprising a connector coupled to one of the first and second IC chips, the connector conforming with one of Universal Serial Bus (USB), High-Definition Multimedia Interface (HDMI), Thunderbolt, Peripheral Component Interconnect Express (PCIe), and Ethernet specifications.

\* \* \* \* \*